(12) United States Patent
Nagatomo et al.

(10) Patent No.: US 11,770,110 B2
(45) Date of Patent: Sep. 26, 2023

(54) ACOUSTIC WAVE DEVICE

(71) Applicant: Murata Manufacturing Co., Ltd., Nagaokakyo (JP)

(72) Inventors: Shou Nagatomo, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 675 days.

(21) Appl. No.: 16/823,439

(22) Filed: Mar. 19, 2020

(65) Prior Publication Data

US 2020/0304094 A1    Sep. 24, 2020

(30) Foreign Application Priority Data

Mar. 22, 2019   (JP) .................................. 2019-054067

(51) Int. Cl.
*H03H 9/02* (2006.01)
*H03H 9/17* (2006.01)
(Continued)

(52) U.S. Cl.
CPC ...... *H03H 9/02559* (2013.01); *H03H 9/0211* (2013.01); *H03H 9/02228* (2013.01);
(Continued)

(58) Field of Classification Search
CPC ............. H03H 9/02559; H03H 9/0211; H03H 9/02228; H03H 9/131; H03H 9/178; H01L 41/0477
See application file for complete search history.

(56) References Cited

U.S. PATENT DOCUMENTS

2011/0050034 A1\* 3/2011 Yamane ............... H03H 9/0222
310/313 C
2013/0285768 A1\* 10/2013 Watanabe .............. H10N 30/01
333/193
(Continued)

FOREIGN PATENT DOCUMENTS

JP        2012-169760 A    9/2012
JP        2014-175885 A    9/2014
(Continued)

OTHER PUBLICATIONS

Official Communication issued in corresponding Japanese Patent Application No. 2019-054067, dated Jun. 29, 2021.

*Primary Examiner* — Bryan P Gordon
(74) *Attorney, Agent, or Firm* — KEATING & BENNETT, LLP

(57) ABSTRACT

An acoustic wave device includes a high-acoustic-velocity layer, a piezoelectric layer made of lithium tantalate, and an interdigital transducer electrode that are successively laminated. An acoustic velocity of a bulk wave propagating in the high-acoustic-velocity layer is higher than an acoustic velocity of an acoustic wave propagating in the piezoelectric layer, and an acoustic velocity $V_{sub}$ of a fast transversal bulk wave propagating in the high-acoustic-velocity layer satisfies $Vsh0 \leq Vsub \leq Vsp$ with respect to an acoustic velocity $Vsh0$ of an SH0 mode and an acoustic velocity $Vsp$ of a mode becoming a spurious of which acoustic velocity is not lower than the acoustic velocity of the SH0 mode, wherein the acoustic velocity $Vsh0$ and the acoustic velocity $Vsp$ is obtained from Eq. (1).

18 Claims, 4 Drawing Sheets

(51) Int. Cl.
*H03H 9/13* (2006.01)
*H10N 30/87* (2023.01)

(52) U.S. Cl.
CPC ............ *H03H 9/131* (2013.01); *H03H 9/178* (2013.01); *H10N 30/877* (2023.02)

(56) References Cited

U.S. PATENT DOCUMENTS

| | | | | |
|---|---|---|---|---|
| 2014/0203893 | A1* | 7/2014 | Kando | H03H 9/02574 333/187 |
| 2017/0187352 | A1* | 6/2017 | Omura | H03H 9/25 |
| 2018/0219525 | A1* | 8/2018 | Chen | H03H 3/08 |

FOREIGN PATENT DOCUMENTS

| | | |
|---|---|---|
| WO | 2012/086639 A1 | 6/2012 |
| WO | 2013/047433 A1 | 4/2013 |

* cited by examiner

ACOUSTIC WAVE DEVICE

CROSS REFERENCE TO RELATED APPLICATIONS

This application claims the benefit of priority to Japanese Patent Application No. 2019-054067 filed on Mar. 22, 2019. The entire contents of this application are hereby incorporated herein by reference.

BACKGROUND OF THE INVENTION

1. Field of the Invention

The present invention relates to an acoustic wave device in which a piezoelectric layer made of lithium tantalate is directly or indirectly laminated on a high-acoustic-velocity layer.

2. Description of the Related Art

An acoustic wave device including a thin piezoelectric layer made of lithium tantalate has been proposed up to now. In an acoustic wave device disclosed in WO 2012/086639, a high-acoustic-velocity member, a low-acoustic-velocity film, a piezoelectric film, and an interdigital transducer (IDT) electrode are laminated in this order. WO 2012/086639 discloses that an acoustic wave can be enclosed in the piezoelectric film by including both the high-acoustic-velocity member and the low-acoustic-velocity film.

WO 2012/086639 further discloses that, according to the acoustic wave device 1 disclosed therein, Q characteristics can be improved because of the above-mentioned multilayer structure.

In the acoustic wave device disclosed in WO 2012/086639, however, a spurious response may generate outside a band depending on the density, the Young's modulus, and the film thickness of a metal used in the interdigital transducer electrode.

SUMMARY OF THE INVENTION

Preferred embodiments of the present invention provide acoustic wave devices in each of which the out-of-band spurious response is small.

According to a preferred embodiment of the present invention, an acoustic wave device includes a high-acoustic-velocity layer, a piezoelectric layer laminated on the high-acoustic-velocity layer and made of lithium tantalate, and an interdigital transducer electrode provided on the piezoelectric layer, wherein an acoustic velocity of a bulk wave propagating in the high-acoustic-velocity layer is higher than an acoustic velocity of an acoustic wave propagating in the piezoelectric layer, and an acoustic velocity Vsub of a fast transversal bulk wave propagating in the high-acoustic-velocity layer satisfies Vsh0≤Vsub≤Vsp with respect to an acoustic velocity Vsh0 of an SH0 mode and an acoustic velocity Vsp of a mode becoming a spurious response of which an acoustic velocity is not lower than the acoustic velocity of the SH0 mode, the acoustic velocity Vsh0 and the acoustic velocity Vsp being obtained from Eq. (1) below:

$$V_{mode} = a^{(2)}_{T_{piezo}}\left((T_{piezo} - c_{T_{piezo}})^2 + b^{(2)}_{T_{piezo}}\right) + a^{(1)}_{T_{piezo}}(T_{piezo} - c_{T_{piezo}}) +$$

Eq. (1)

-continued
$$a^{(2)}_{T_e}((T_e - c_{T_e})^2 + b^{(2)}_{T_e}) + a^{(1)}_{T_e}(T_e - c_{T_e}) + a^{(2)}_{\theta}((\theta - c_{\theta})^2 + b^{(2)}_{\theta}) +$$
$$a^{(1)}_{\theta}(\theta - c_{\theta}) + a^{(2)}_Y((Y - c_Y)^2 + b^{(2)}_Y) + a^{(1)}_Y(Y - c_Y) + a^{(2)}_{\rho}((\rho - c_{\rho})^2 + b^{(2)}_{\rho}) +$$
$$a^{(1)}_{\rho}(Y - c_{\rho}) + d_{T_{piezo}T_e}(T_{piezo} - c_{T_{piezo}})(T_e - c_{T_e}) +$$
$$d_{T_{piezo}\theta}(T_{piezo} - c_{T_{piezo}})(\theta - c_{\theta}) + d_{T_{piezo}Y}(T_{piezo} - c_{T_{piezo}})(Y - c_Y) +$$
$$d_{T_{piezo}\rho}(T_{piezo} - c_{T_{piezo}})(Y - c_{\rho}) + d_{T_e\theta}(T_e - c_{T_e})(\theta - c_{\theta}) +$$
$$d_{T_eY}(T_e - c_{T_e})(Y - c_Y) + d_{T_e\rho}(T_e - c_{T_e})(\rho - c_{\rho}) +$$
$$d_{\theta Y}(\theta - c_{\theta})(Y - c_Y) + d_{\theta\rho}(T_\theta - c_{\theta})(\rho - c_{\rho}) + d_{Y_{\rho}}(Y - c_Y)(\rho - c_{\rho}) + e$$

In Eq. (1), coefficients for Vsh0 and Vsp are as listed in Table 1 below:

TABLE 1

| MODE ACOUSTIC VELOCITY | V_SH0 | V_SP |
|---|---|---|
| aTpiezo(2) | 7.048E+00 | 4.060E+01 |
| aTpiezo(1) | −1.560E+00 | −3.466E+00 |
| bTpiezo(2) | −1.250E−02 | −1.250E−02 |
| cTpiezo | 3.500E−01 | 3.500E−01 |
| aTe(2) | 5.482E+01 | 7.950E+01 |
| aTe(1) | −7.154E+00 | −7.636E+00 |
| bTe(2) | 3.200E−03 | −3.200E−03 |
| cTe | 1.200E−01 | 1.200E−01 |
| a θ (2) | 0.000E+00 | 0.000E+00 |
| a θ (1) | 8.215E−03 | 1.271E−02 |
| b θ (2) | 0.000E+00 | 0.000E+00 |
| c θ | 1.395E+02 | 1.395E+02 |
| aY(2) | 0.000E+00 | 3.371E−06 |
| aY(1) | 1.347E−04 | −6.086E−04 |
| bY(2) | 0.000E+00 | −3.954E+04 |
| cY | 3.515E+02 | 3.515E+02 |
| a ρ (2) | 3.156E−03 | 3.849E−03 |
| a ρ (1) | −7.670E−02 | −8.435E−02 |
| b ρ (2) | −5.832E+01 | −5.832E+01 |
| c ρ | 1.350E+01 | 1.350E+01 |
| dTpiezoTe | 0.000E+00 | 0.000E+00 |
| dTpiezo θ | 0.000E+00 | 0.000E+00 |
| dTpiezoY | 0.000E+00 | 0.000E+00 |
| dTpiezo ρ | 9.988E−02 | 9.090E−02 |
| dTe θ | 0.000E+00 | 0.000E+00 |
| dTeY | −7.413E−03 | −1.586E−02 |
| dTe ρ | 0.000E+00 | 0.000E+00 |
| d θ Y | 0.000E+00 | 0.000E+00 |
| d θ ρ | 0.000E+00 | 0.000E+00 |
| dY ρ | −4.456E−05 | −9.875E−05 |
| e | 3.248E+00 | 4.270E+00 |

According to another preferred embodiment of the present invention, an acoustic wave device includes a high-acoustic-velocity layer, an intermediate layer laminated on the high-acoustic-velocity layer and made of silicon oxide, a piezoelectric layer laminated on the intermediate layer and made of lithium tantalate, and an interdigital transducer electrode provided on the piezoelectric layer, wherein an acoustic velocity of a bulk wave propagating in the high-acoustic-velocity layer is higher than an acoustic velocity of an acoustic wave propagating in the piezoelectric layer, and an acoustic velocity Vsub of a fast transversal bulk wave propagating in the high-acoustic-velocity layer satisfies Vsh0≤Vsub≤Vsp with respect to an acoustic velocity Vsh0 of an SH0 mode and an acoustic velocity Vsp of a mode becoming a spurious response of which acoustic velocity is not lower than the acoustic velocity of the SH0 mode, the acoustic velocity Vsh0 and the acoustic velocity Vsp being obtained from Eq. (2) below:

$$V_{mode} = a^{(2)}_{T_{piezo}}\left((T_{piezo} - c_{T_{piezo}})^2 + b^{(2)}_{T_{piezo}}\right) +$$
$$a^{(1)}_{T_{piezo}}(T_{piezo} - c_{T_{piezo}}) + a^{(2)}_{T_{int}}((T_{int} - c_{T_{int}})^2 + b^{(2)}_{T_{int}}) +$$
$$a^{(1)}_{T_{int}}(T_{int} - c_{T_{int}}) + a^{(2)}_{T_e}((T_e - c_{T_e})^2 + b^{(2)}_{T_e}) +$$
$$a^{(1)}_{T_e}(T_e - c_{T_e}) + a^{(2)}_{\theta}((\theta - c_{\theta})^2 + b^{(2)}_{\theta}) + a^{(1)}_{\theta}(\theta - c_{\theta}) +$$
$$a^{(2)}_{Y}((Y - c_Y)^2 + b^{(2)}_{Y}) + a^{(1)}_{Y}(Y - c_Y) + a^{(2)}_{\rho}((\rho - c_{\rho})^2 + b^{(2)}_{\rho}) +$$
$$a^{(1)}_{\rho}(Y - c_{\rho}) + d_{T_{piezo}T_{int}}(T_{piezo} - c_{T_{piezo}})(T_{int} - c_{int}) +$$
$$d_{T_{piezo}T_e}(T_{piezo} - c_{T_{piezo}})(T_e - c_{T_e}) + d_{T_{piezo}\theta}(T_{piezo} - c_{T_{piezo}})(\theta - c_{\theta}) +$$
$$d_{T_{piezo}Y}(T_{piezo} - c_{T_{piezo}})(Y - c_Y) + d_{T_{piezo}\rho}(T_{piezo} - c_{T_{piezo}})(Y - c_{\rho}) +$$
$$d_{T_{int}T_e}(T_{int} - c_{T_{int}})(T_e - c_{T_e}) + d_{T_{int}\theta}(T_{int} - c_{T_e})(\theta - c_{\theta}) +$$
$$d_{T_{int}Y}(T_{int} - c_{T_{int}})(Y - c_Y) + d_{T_{int}\rho}(T_{int} - c_{T_{int}})(\rho - c_{\rho}) +$$
$$d_{T_e\theta}(T_e - c_{T_e})(\theta - c_{\theta}) + d_{T_eY}(T_e - c_{T_e})(Y - c_Y) +$$
$$d_{T_e\rho}(T_e - c_{T_e})(\rho - c_{\rho}) + d_{\theta Y}(\theta - c_{\theta})(Y - c_Y) +$$
$$d_{\theta\rho}(T_{\theta} - c_{\theta})(\rho - c_{\rho}) + d_{Y\rho}(Y - c_Y)(\rho - c_{\rho}) + e$$

Eq. (2)

In Eq. (2), coefficients for Vsh0 and Vsp are as listed in Table 2 below:

TABLE 2

| MODE ACOUSTIC VELOCITY | V_SH0 | V_SP |
| --- | --- | --- |
| aTpiezo(2) | 0.000E+00 | −1.163E+01 |
| aTpiezo(1) | 8.939E−01 | −1.176E+00 |
| bTpiezo(2) | 0.000E+00 | 1.250E−02 |
| cTpiezo | 2.500E−01 | 2.500E−01 |
| aTint(2) | 0.000E+00 | −2.248E+01 |
| aTint(1) | −5.610E−01 | 1.908E+00 |
| bTint(2) | 0.000E+00 | 1.250E−02 |
| cTint | 2.500E−01 | 2.500E−01 |
| aTe(2) | 4.789E+01 | 0.000E+00 |
| aTe(1) | −6.682E+00 | −6.371E+00 |
| bTe(2) | 2.000E−03 | 0.000E+00 |
| cTe | 1.000E−01 | 1.000E−01 |
| a θ (2) | −2.255E−04 | 0.000E+00 |
| a θ (1) | 2.552E−04 | 0.000E+00 |
| b θ (2) | 1.667E+02 | 0.000E+00 |
| c θ | 1.400E+02 | 1.400E+02 |
| aY(2) | 0.000E+00 | 0.000E+00 |
| aY(1) | −2.030E−05 | 6.691E−04 |
| bY(2) | 0.000E+00 | 0.000E+00 |
| cY | 4.218E+02 | 4.218E+02 |
| a ρ (2) | 2.215E−03 | 0.000E+00 |
| a ρ (1) | −5.835E−02 | −4.208E−02 |
| b ρ (2) | 5.832E+01 | 0.000E+00 |
| c ρ | 1.350E+01 | 1.350E+01 |
| dTpiezoTin | 2.593E+00 | −2.616E+01 |
| dTpiezoTe | 1.069E+01 | 0.000E+00 |
| dTpiezo θ | 0.000E+00 | 0.000E+00 |
| dTpiezoY | −2.009E−03 | −2.664E−03 |
| dTpiezo ρ | 7.747E−02 | 0.000E+00 |
| dTintTe | 0.000E+00 | 2.905E+01 |
| dTint θ | 0.000E+00 | −4.267E−02 |
| dTintY | 5.308E−04 | 0.000E+00 |
| dTint ρ | 0.000E+00 | 1.901E−01 |
| dTe θ | 0.000E+00 | 1.520E−01 |
| dTeY | −5.003E−03 | 7.229E−03 |
| dTe ρ | −1.701E−01 | −5.170E−01 |
| d θ Y | 0.000E+00 | 0.000E+00 |
| d θ ρ | 0.000E+00 | 9.593E−04 |
| dY ρ | −3.071E−05 | 0.000E+00 |
| e | 3.120E+00 | 5.104E+00 |

According to the preferred embodiments of the present invention, the out-of-band spurious response is able to be significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified from the following description of preferred embodiments of the present invention with reference to the drawings.

It to be noted that the preferred embodiments explained in this Description are merely illustrative and some of individual components are able to be optionally replaced or combined between the different preferred embodiments.

Figure 1A:
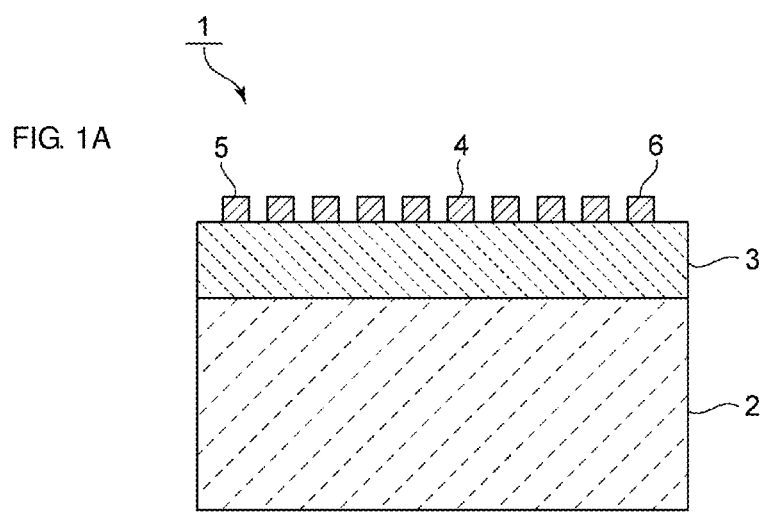
FIG. 1A is a front sectional view of an acoustic wave device according to a first preferred embodiment of the present invention.
Figure 1B:
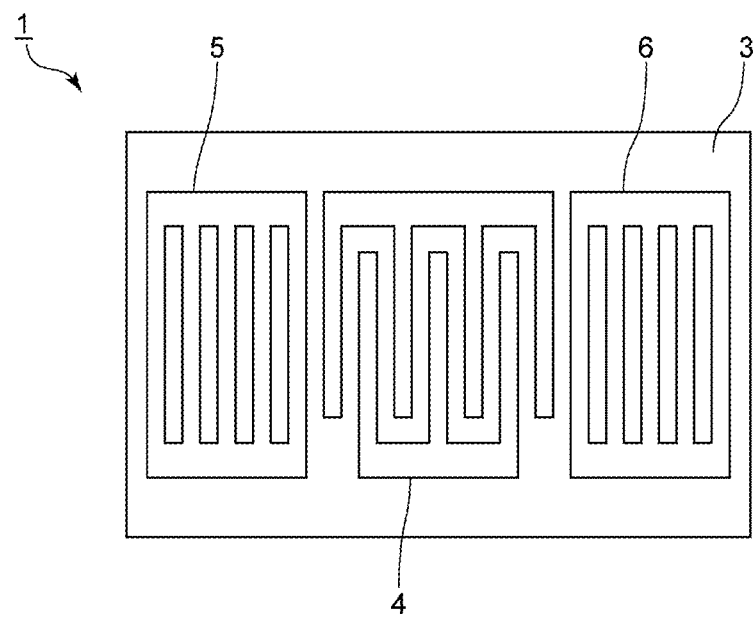
FIG. 1B is a plan view of the acoustic wave device according to the first preferred embodiment of the present invention.

FIG. 1A is a front sectional view of an acoustic wave device 1 according to a first preferred embodiment of the present invention, and FIG. 1B is a plan view of the acoustic wave device 1.

The acoustic wave device 1 includes a Si support substrate defining and functioning as a high-acoustic-velocity layer 2. A piezoelectric layer 3 made of a LiTaO$_3$ layer is laminated on the high-acoustic-velocity layer 2. An interdigital transducer electrode 4 and reflectors 5 and 6 are provided on the piezoelectric layer 3. Accordingly, an acoustic resonator is defined by the above-described components.

Assuming that a wavelength determined in accordance with the electrode finger pitch of the interdigital transducer electrode 4 is denoted by λ, a thickness of the piezoelectric layer 3 is preferably set to be not more than about 1λ, for example. Even when the piezoelectric layer 3 is very thin, the piezoelectric layer 3 can enclose an acoustic wave therein because it is laminated on the high-acoustic-velocity layer 2. More specifically, the high-acoustic-velocity layer 2 is made of a high-acoustic-velocity material, for example, Si. An acoustic velocity of a bulk wave propagating in the high-acoustic-velocity material is higher than that of an acoustic wave propagating in the piezoelectric layer 3.

Accordingly, the elastic wave is able to be enclosed or confined in the piezoelectric layer 3.

The interdigital transducer electrode 4 and the reflectors 5 and 6 may be made of various metals or alloys. At least one selected from a group of Ni, Cr, Nb, Mo, Ru, W, Ir, and alloys including those metals as main components is preferably used as the above-described metal, for example. In such a case, the electrochemical coupling coefficient and the Q value can both be increased.

The interdigital transducer electrode 4 and the reflectors 5 and 6 may each be a multilayer metal film including a plurality of metal films that are laminated. A metal used for the multilayer metal film is also not limited to any particular one, and Ti, Al, Cu or the like, for example, are able to be further included in addition to the above-mentioned metals.

In the first preferred embodiment, the interdigital transducer electrode 4 and the reflectors 5 and 6 are each preferably made of, for example, Ti/Mo/Ti laminated in this order from the side opposite from the piezoelectric layer 3, i.e., from the upper surface side.

An acoustic velocity Vsub of a fast transversal bulk wave propagating in the high-acoustic-velocity layer 2 satisfies Vsh0≤Vsub≤Vsp with respect to an acoustic velocity Vsh0 of an SH0 mode and an acoustic velocity Vsp of a mode becoming a spurious response of which acoustic velocity is not lower than the acoustic velocity of the SH0 mode, the acoustic velocity Vsh0 and the acoustic velocity Vsp being obtained from Eq. (1) below. Because of Vsh0≤Vsub and Vsub≤Vsp, an acoustic wave of the SH0 mode is able to be effectively enclosed or confined in the piezoelectric layer 3 while an acoustic wave becoming the spurious response is able to be leaked to the high-acoustic-velocity layer 2. Thus, the spurious response is able to be significantly reduced.

The inventors of preferred embodiments of the present invention have discovered that the above relationship in acoustic velocity is satisfied by setting the coefficients in Eq. (1) for Vsh0 and Vsp as listed in Table 3 below.

TABLE 3

| MODE ACOUSTIC VELOCITY | V_SH0 | V_SP |
| --- | --- | --- |
| aTpiezo(2) | 7.048E+00 | 4.060E+01 |
| aTpiezo(1) | −1.560E+00 | −3.466E+00 |
| bTpiezo(2) | −1.250E−02 | −1.250E−02 |
| cTpiezo | 3.500E−01 | 3.500E−01 |
| aTe(2) | 5.482E+01 | 7.950E+01 |
| aTe(1) | −7.154E+00 | −7.636E+00 |
| bTe(2) | −3.200E−03 | −3.200E−03 |
| cTe | 1.200E−01 | 1.200E−01 |
| a θ (2) | 0.000E+00 | 0.000E+00 |
| a θ (1) | 8.215E−03 | 1.271E−02 |
| b θ (2) | 0.000E+00 | 0.000E+00 |
| c θ | 1.395E+02 | 1.395E+02 |
| aY(2) | 0.000E+00 | 3.371E−06 |
| aY(1) | 1.347E−04 | −6.086E−04 |
| bY(2) | 0.000E+00 | −3.954E+04 |
| cY | 3.515E+02 | 3.515E+02 |
| a ρ (2) | 3.156E−03 | 3.849E−03 |
| a ρ (1) | −7.670E−02 | −8.435E−02 |
| b ρ (2) | −5.832E+01 | −5.832E+01 |
| c ρ | 1.350E+01 | 1.350E+01 |
| dTpiezoTe | 0.000E+00 | 0.000E+00 |
| dTpiezo θ | 0.000E+00 | 0.000E+00 |
| dTpiezoY | 0.000E+00 | 0.000E+00 |
| dTpiezo ρ | 9.988E−02 | 9.090E−02 |
| dTe θ | 0.000E+00 | 0.000E+00 |
| dTeY | −7.413E−03 | −1.586E−02 |
| dTe ρ | 0.000E+00 | 0.000E+00 |
| d θ Y | 0.000E+00 | 0.000E+00 |
| d θ ρ | 0.000E+00 | 0.000E+00 |

TABLE 3-continued

| MODE ACOUSTIC VELOCITY | V_SH0 | V_SP |
| --- | --- | --- |
| dY ρ | −4.456E−05 | −9.875E−05 |
| e | 3.248E+00 | 4.270E+00 |

The acoustic velocity Vsh0 (km/sec) of the SH0 mode is able to be calculated from the film thickness $T_{piezo}$ (λ) and the second Euler angle θ (°) of the piezoelectric layer 3 and from the film thickness $T_e$ (λ), the density ρ (g/cm$^3$), and the Young's modulus Y (GPa) of the interdigital transducer electrode 4. The acoustic velocity of a spurious mode faster than the acoustic velocity of the SH0 mode is able to be similarly calculated.

Accordingly, the spurious response is able to be significantly reduced by applying the coefficients listed in Table 3 in order that Vsh0 and Vsp calculated as described above satisfy Vsh0≤Vsub≤Vsp.

In the structure including the thin piezoelectric layer 3 as in the acoustic wave device 1, acoustic energy of acoustic waves is extremely concentrated in the piezoelectric layer 3 and the interdigital transducer electrode 4. Therefore, various plate modes are generated in the piezoelectric layer 3. Usually, one of those plate modes is utilized as a main resonant mode. The SH0 mode, for example, is preferably utilized in the first preferred embodiment. In that case, the remaining plate modes are all spurious responses. The remaining plate modes are preferably reduced or prevented, for example, because they may cause degradation of characteristics.

On the other hand, dependencies of the various plate modes upon the acoustic velocity are determined by the structure of the interdigital transducer electrode 4, the cut-angles of the piezoelectric layer 3, and the film thickness of the piezoelectric layer 3, and those dependencies are different for each of the modes.

With respect to the case of using LiTaO$_3$ as the piezoelectric layer 3 and utilizing the SH0 mode as the main mode, the inventors of preferred embodiments of the present invention determined a mode becoming a faster spurious response than the SH0 mode by a finite element method (FEM) simulation in which conditions of leaking the above spurious mode to the support substrate defining and functioning as the high-acoustic-velocity layer 2 were set as follows:

Wavelength determined by the pitch of electrode fingers=about 1 μm
Number of the electrode fingers=infinite
Duty ratio=about 0.5

A concrete experimental example will be described below.

The acoustic wave device 1 according to the first preferred embodiment was prepared as an Example 1 with parameters set as described below.

High-acoustic-velocity layer 2: support substrate including Si, Euler angles (−45°, −54.7°, 60°)
Piezoelectric layer 3: 42° Y cut X SAW propagation LiTaO$_3$, thickness about 0.2λ
Multilayer structure of the interdigital transducer electrode 4 and the reflectors 5 and 6: multilayer metal film of Ti film/Mo film/Ti film successively laminated in order from above, thicknesses; Ti film=about 0.2% of λ, Mo film=about 5.2% of λ, Ti film=about 0.6% of λ

In the Example 1, the acoustic velocity Vsh0 of the SH0 mode and Vsp were calculated from the above Eq. (1).

Vsh0=about 4319 m/sec and Vsp=about 5884 m/sec were obtained. Additionally, Vsub=about 5844 m/sec was obtained.

On the other hand, a simulation was performed on a Comparative Example 1 in which an interdigital transducer electrode was a multilayer metal film of Ti film/Al film/Pt film successively laminated in order from above, and in which thicknesses of the individual layers were set to Ti film=about 0.2% of λ/Al film=about 5% of λ/Pt film=about 2% of 1 such that the same or substantially the same resonant frequency was obtained in the Example 1 and the Comparative Example 1. As a result of determining the acoustic velocity Vsh0 of the SH0 mode in an acoustic wave device of the Comparative Example 1, Vsh0=4010 m/sec was obtained. Furthermore, Vsp=about 5727 m/sec was obtained.

Figure 2:
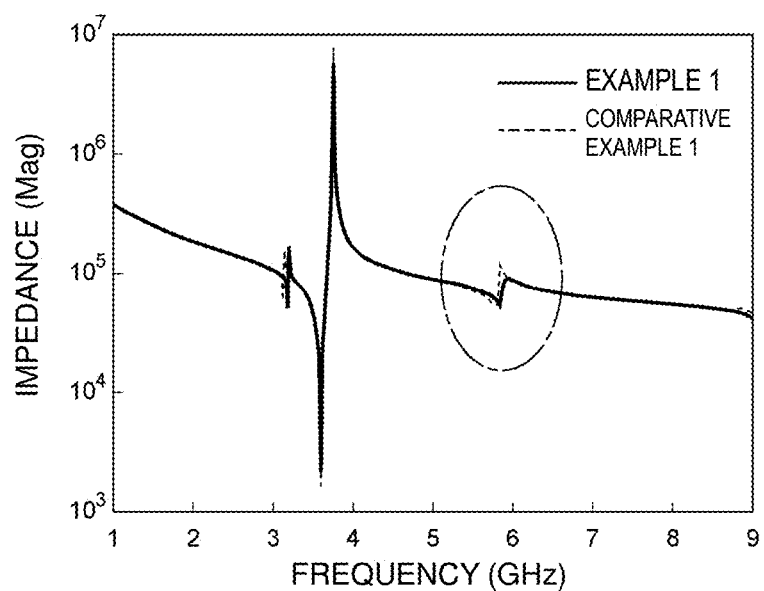
FIG. 2 is a graph depicting impedance characteristics of the acoustic wave device according to the first preferred embodiment of the present invention, prepared as an Example 1, and an acoustic wave device of a Comparative Example 1.

FIG. 2 is a graph depicting impedance characteristics of the acoustic wave devices of the Example 1 and the Comparative Example 1. As seen from FIG. 2, a response of the SH0 mode appears at about 3700 MHz in both of the acoustic wave devices. Moreover, a spurious response appears at about 5700 MHz to about 6000 MHz. That spurious response corresponds to a mode having a faster acoustic velocity than the SH0 mode at a level next to the SH0 mode, and such a mode is referred to as an S0 Lamb wave.

In FIG. 2, a solid line represents the results obtained with the Example 1 and a dotted line represents the results obtained with the Comparative Example 1. As seen from comparison between the solid line and the dotted line, the spurious response at about 5700 MHz to about 6000 MHz is smaller in the Example 1 than that in the Comparative Example 1.

The above result is attributable to the fact that Vsh0≤Vsub≤Vsp is satisfied in the Example 1.

As described above, the acoustic velocity of the SH0 mode or the plate mode, for example, the S0 Lamb wave, is determined by the film thickness and the cut-angle of the piezoelectric layer 3 and by the film thickness, the density, and the elastic modulus (Young's modulus) of the interdigital transducer electrode 4. In the case of the multilayer metal film, the volume mean average of a parameter for each material may be obtained from a volume ratio of each metal layer to the interdigital transducer electrode. Practically, a taper angle of the interdigital transducer electrode is close to a right angle in many cases, and a line width of the electrode finger is able to be regarded as constant or substantially constant. In other words, the volume ratio may be replaced with a film thickness ratio. It is to be noted that the acoustic velocity calculated in the preferred embodiments of the present invention is not always equal or substantially equal to the acoustic velocity estimated from an actual position of the spurious response. This is because the former is the acoustic velocity of an ideal plate mode and is not affected by the support substrate, and the latter is the acoustic velocity affected by mixed interaction between the plate mode and the support substrate.

While the first preferred embodiment describes the case of using the SH0 mode and significantly reducing the spurious response of the S0 Lamb wave, the spurious response of which influence is able to be significantly reduced is not limited to the S0 Lamb wave.

Furthermore, θ in the Eq. (1) is the second Euler angle, and the second Euler angle θ is preferably in a range of about 120°≤θ≤about 160°, for example. Expressing the above point regarding a cut-angle, the cut-angle is preferably in a range of not smaller than about −10° and not larger than about +65° in the Y cut X SAW propagation, for example. It is to be noted that θ=42° and θ=132° are equivalent in terms of the second Euler angle θ and any one of those equivalent second Euler angles may be applied in the preferred embodiments of the present invention.

Figure 3:
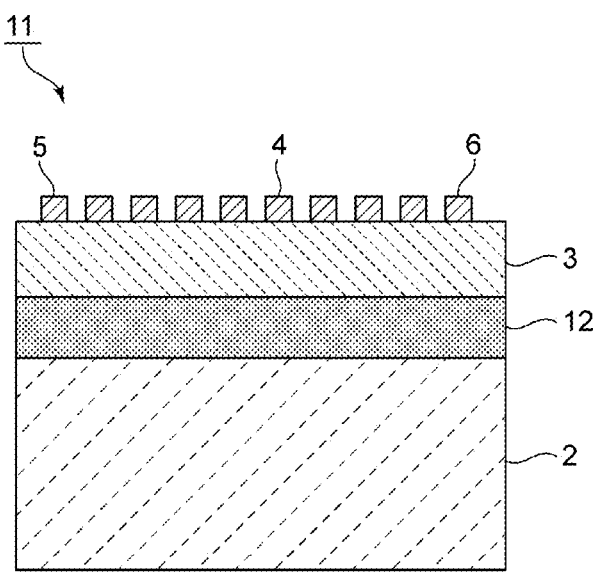
FIG. 3 is a front sectional view of an acoustic wave device according to a second preferred embodiment of the present invention.

FIG. 3 is a front sectional view of an acoustic wave device 11 according to a second preferred embodiment of the present invention. In the acoustic wave device 11, an intermediate layer 12 preferably including, for example, silicon oxide is provided between the Si support substrate defining and functioning as the high-acoustic-velocity layer 2 and the piezoelectric layer 3 made of LiTaO$_3$. The other structure of the acoustic wave device 11 is the same as or similar to that of the acoustic wave device 1.

The acoustic velocity of a bulk wave propagating in the intermediate layer 12 made of silicon oxide is lower than that of the bulk wave propagating in the piezoelectric layer 3. The material of the intermediate layer 12 is not limited to silicon oxide and it may be, for example, a compound obtained by adding a small amount of fluorine, carbon, boron, nitrogen, or hydrogen to silicon oxide, or a material including silicon oxide as a main component and further including a silanol group. Alternatively, the intermediate layer 12 may be multilayer structure including a plurality of layers that are each made of a low-acoustic-velocity material. A bonding layer including titanium or nickel may be located between pairs of layers among the plurality of layers. In such a case, a thickness of the intermediate layer 12 is provided by an overall thickness of the multilayer structure.

Also in the acoustic wave device 11 according to the second preferred embodiment, the mode becoming the spurious response is able to be significantly reduced because Vsh0≤Vsub≤Vsp is satisfied. However, coefficients in the following Eq. (2) that determine Vsh0 and Vsp are as listed in the following Table 4 because the acoustic wave device 11 has a different multilayer structure.

TABLE 4

| MODE ACOUSTIC VELOCITY | V_SH0 | V_SP |
|---|---|---|
| aTpiezo(2) | 0.000E+00 | −1.163E+01 |
| aTpiezo(1) | 8.939E−01 | −1.176E+00 |
| bTpiezo(2) | 0.000E+00 | 1.250E−02 |
| cTpiezo | 2.500E−01 | 2.500E−01 |
| aTint(2) | 0.000E+00 | −2.248E+01 |
| aTint(1) | −5.610E−01 | 1.908E+00 |
| bTint(2) | 0.000E+00 | 1.250E−02 |
| cTint | 2.500E−01 | 2.500E−01 |
| aTe(2) | 4.789E+01 | 0.000E+00 |
| aTe(1) | −6.682E+01 | −6.371E+00 |
| bTe(2) | 2.000E−03 | 0.000E+00 |
| cTe | 1.000E−01 | 1.000E−01 |
| a θ (2) | −2.255E−04 | 0.000E+00 |
| a θ (1) | 2.552E−04 | 0.000E+00 |
| b θ (2) | 1.667E+02 | 0.000E+00 |
| c θ | 1.400E+02 | 1.400E+02 |
| aY(2) | 0.000E+00 | 0.000E+00 |
| aY(1) | −2.030E−05 | 6.691E−04 |
| bY(2) | 0.000E+00 | 0.000E+00 |
| cY | 4.218E+02 | 4.218E+02 |
| a ρ (2) | 2.215E−03 | 0.000E+00 |
| a ρ (1) | −5.835E−02 | −4.208E−02 |
| b ρ (2) | 5.832E+01 | 0.000E+00 |
| c ρ | 1.350E+01 | 1.350E+01 |
| dTpiezoTin | 2.593E+00 | −2.616E+01 |
| dTpiezoTe | 1.069E+01 | 0.000E+00 |
| dTpiezo θ | 0.000E+00 | 0.000E+00 |
| dTpiezoY | −2.009E−03 | −2.664E−03 |
| dTpiezo ρ | 7.747E−02 | 0.000E+00 |
| dTintTe | 0.000E+00 | 2.905E+01 |
| dTint θ | 0.000E+00 | −4.267E−02 |

TABLE 4-continued

| MODE ACOUSTIC VELOCITY | V_SH0 | V_SP |
|---|---|---|
| dTintY | 5.308E−04 | 0.000E+00 |
| dTint ρ | 0.000E+00 | 1.901E−01 |
| dTe θ | 0.000E+00 | 1.520E−01 |
| dTeY | −5.003E−03 | 7.229E−03 |
| dTe ρ | −1.701E−01 | −5.170E−01 |
| d θ Y | 0.000E+00 | 0.000E+00 |
| d θ ρ | 0.000E+00 | 9.593E−04 |
| dY ρ | −3.071E−05 | 0.000E+00 |
| e | 3.120E+00 | 5.104E+00 |

Figure 4:
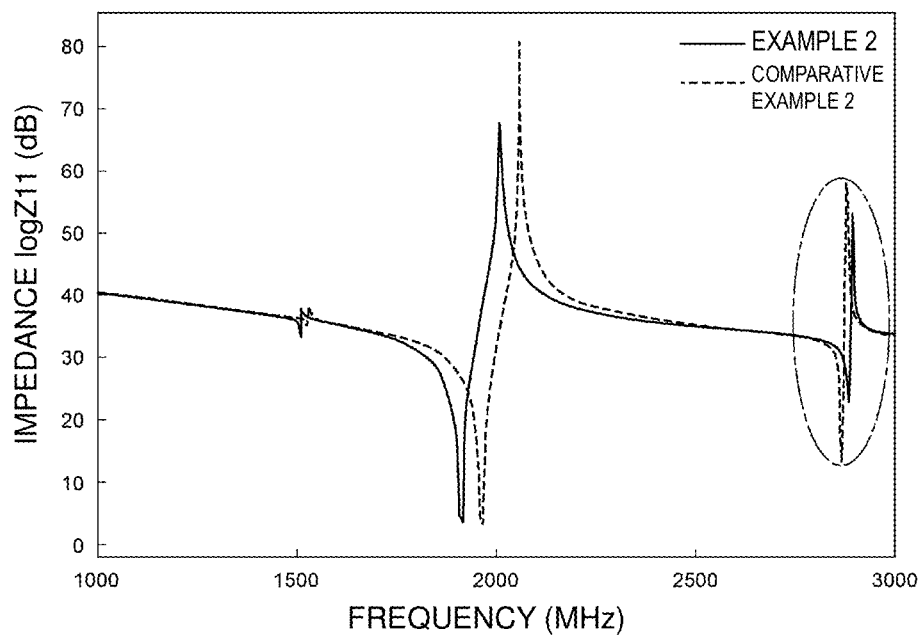
FIG. 4 is a graph depicting impedance characteristics of the acoustic wave device according to the second preferred embodiment of the present invention, prepared as an Example 2, and an acoustic wave device of a Comparative Example 2.

FIG. 4 is a graph depicting impedance characteristics of the acoustic wave device according to the second preferred embodiment, prepared as an Example 2, and an acoustic wave device of a Comparative Example 2.

The acoustic wave device of the Example 2 is defined as follows.

Wavelength determined by the pitch of electrode fingers=about 2 μm
Number of the electrode fingers=infinite
Duty ratio=about 0.5
High-acoustic-velocity layer 2: support substrate including Si, Euler angles (0°, −45°, 30°)
Intermediate layer 12: SiO$_2$ film, thickness about 0.2λ
Piezoelectric layer 3: 50° Y cut X SAW propagation LiTaO$_3$, thickness about 0.2λ
Multilayer structure of the interdigital transducer electrode 4 and the reflectors 5 and 6: Al film/Ru film, film thickness; Al film=about 4% of λ, Ru film=about 4% of λ, namely, absolute film thickness of the interdigital transducer electrode 4=about 8% of the wavelength λ

Vsh0 and Vsp in the acoustic wave device of the Example 2 were calculated from the Eq. (2) and Table 4 as follows.
Vsh0=about 3458 m/sec
Vsp=about 5640 m/sec
Additionally, Vsub=about 5575 m/sec was obtained.

For comparison, an acoustic wave device of the Comparative Example 2 was prepared. In the Comparative Example 2, an interdigital transducer electrode and reflectors had a multilayer structure of Al film/Ru film with film thicknesses set to Al film=about 4% of λ and Ru film=about 6% of λ. The other structure is the same as or similar to that in the Example 2.

In the Comparative Example 2, Vsh0=about 3259 m/sec and Vsp=about 5498 m/sec were obtained.

In FIG. 4, a solid line represents the result obtained with the Example 2 and a dotted line represents the result obtained with the Comparative Example 2. As seen from FIG. 4, a response of the SH0 mode appears at about 1800 MHz to about 2100 MHz in both of the Example 2 and the Comparative Example 2. Moreover, a spurious response corresponding to the S0 mode appears at about 2700 MHz to about 3000 MHz. It is further understood that the above spurious response is able to be significantly reduced in the Example 2 in comparison with that in the Comparative Example 2.

In the Comparative Example 2, because of Vsp Vsub, the spurious response is enclosed and thus a significant response appears.

As described above, even when a predetermined relationship in the acoustic velocity between the high-acoustic-velocity layer and the piezoelectric layer is satisfied by using an electrode material having the high Young's modulus, for example, Ru, the spurious response is able to be significantly reduced by adjusting a film thickness ratio between (among) the individual electrode layers.

Figure 5:
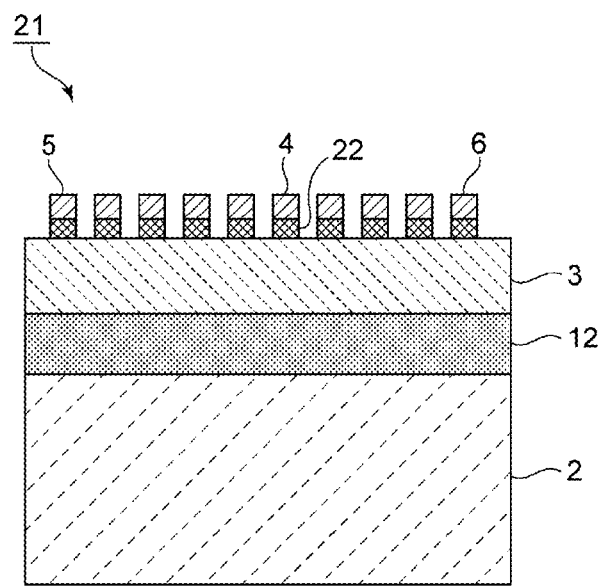
FIG. 5 is a front sectional view of an acoustic wave device according to a third preferred embodiment of the present invention.

FIG. 5 is a front sectional view of an acoustic wave device 21 according to a third preferred embodiment of the present invention. In the acoustic wave device 21, a dielectric layer 22 is provided between the piezoelectric layer 3 and each of the interdigital transducer electrode 4 and the reflectors 5 and 6. The acoustic wave device 21 has the same or similar structure to that of the acoustic wave device 11 except for the dielectric layer 22. Thus, in the third preferred embodiment, the dielectric layer 22 may be provided between the interdigital transducer electrode 4 and the piezoelectric layer 3. Various dielectrics are able to be used as materials of the dielectric layer 22 without being limited to particular ones. Preferably, for example, at least one dielectric selected from a group of Al$_2$O$_3$, MgO, BeO, HfO$_2$, AlN, SiN, TiN, ZrN, SiC, TiC, DLC, B$_4$C, TiB$_2$, ZrB$_2$, and NbB$_2$ is used. In the case of using such a dielectric, the Q value is able to be further increased and the out-of-band spurious response is able to be further significantly reduced.

A concrete experimental example regarding the third preferred embodiment will be described below.

Figure 6:
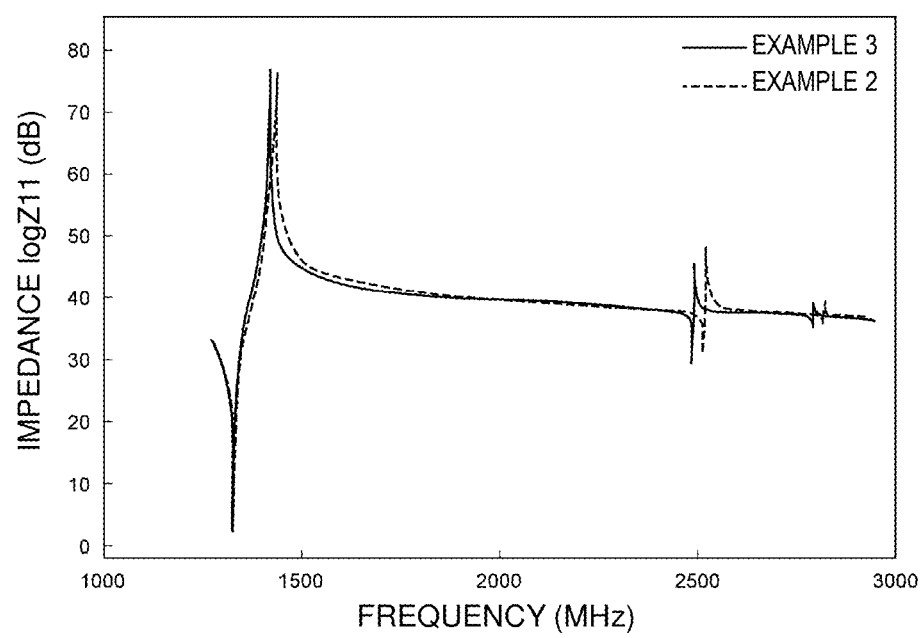
FIG. 6 is a graph depicting impedance characteristics of the acoustic wave device according to the third preferred embodiment of the present invention, prepared as an Example 3, and the acoustic wave device of the Example 2.

FIG. 6 is a graph depicting impedance characteristics of the acoustic wave device according to the third preferred embodiment, prepared as an Example 3, and the acoustic wave device of the Example 2.

In the Example 3, an Al$_2$O$_3$ film with a thickness of about 0.015λ was provided as the dielectric layer 22. The other structure of the acoustic wave device of Example 3 was the same or similar to that of the acoustic wave device of Example 2.

As seen from FIG. 6, according to the Example 3, the spurious response appearing at about 2700 MHz to about 3000 MHz is able to be further significantly reduced in comparison with that in the Example 2.

While the Si support substrate is included as the high-acoustic-velocity layer 2 in the above-described first through third preferred embodiments, another type of high-acoustic-velocity material may also be used without being limited to Si. In other words, various high-acoustic-velocity materials are able to be optionally used insofar as the acoustic velocity of a bulk wave propagating in the material is higher than that of an acoustic wave propagating in LiTaO$_3$.

While the high-acoustic-velocity layer 2 is made of the Si support substrate, its main component may be another type of semiconductor, for example, germanium, gallium, nitride, or silicon carbide. In the case of using the semiconductor, productivity is able to be increased.

Alternatively, the main component of the high-acoustic-velocity layer 2 may be a dielectric, for example, quartz, spinel, alumina, or diamond. In that case, resistance loss is able to be significantly reduced.

The acoustic wave device may further include a support substrate that supports the high-acoustic-velocity layer 2 made the high-acoustic-velocity material. In other words, the high-acoustic-velocity layer 2 is not always required to define and function as the support substrate.

Moreover, the dielectric layer 22 in the third preferred embodiment may be provided in a state of not only being positioned under the electrode fingers of the interdigital transducer electrode 4, but also filling gaps between the electrode fingers. As an alternative, the dielectric layer 22 may cover an entire or substantially an entire upper surface of the piezoelectric layer 3.

In the acoustic wave device according to the preferred embodiments of the present invention, a protective film may be provided to cover the interdigital transducer electrode 4.

The provision of such a protective film ensures protection of the acoustic wave device from external environments. Furthermore, frequency characteristics are able to be adjusted with an increase of mass added by the protective film. Various dielectrics are able to be optionally included as the protective film.

In the acoustic wave device 11 according to the second preferred embodiment, a high-acoustic-impedance layer having a higher transverse acoustic impedance than the intermediate layer 12, which is a low-acoustic-velocity film, may be provided between the high-acoustic-velocity layer 2 including the Si support substrate and the intermediate layer 12. In that case, the Q value is able to be further increased. Although materials of the high-acoustic-impedance layer are not limited to particular ones, aluminum nitride (AlN), silicon nitride (SiNx), hafnium nitride (HfN), tantalum pentoxide ($Ta_2O_5$), hafnium oxide (HfOx), diamond-like carbon (DLC), or the like is preferably used, for example. In that case, the Q value is able to be further increased.

While the intermediate layer 12 is made of silicon oxide, it may include atoms of fluorine, boron, nitrogen, or the like, for example. Temperature characteristics are able to be significantly improved with addition of those atoms.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a high-acoustic-velocity layer;
a piezoelectric layer laminated on the high-acoustic-velocity layer, the piezoelectric layer being made of lithium tantalate; and
an interdigital transducer electrode provided on the piezoelectric layer; wherein
an acoustic velocity of a bulk wave propagating in the high-acoustic-velocity layer is higher than an acoustic velocity of an acoustic wave propagating in the piezoelectric layer; and
an acoustic velocity Vsub of a fast transversal bulk wave propagating in the high-acoustic-velocity layer satisfies Vsh0≤Vsub≤Vsp with respect to an acoustic velocity Vsh0 of an SH0 mode and an acoustic velocity Vsp of a mode becoming a spurious response of which acoustic velocity is not lower than the acoustic velocity of the SH0 mode, the acoustic velocity Vsh0 and the acoustic velocity Vsp being obtained from Eq. (1) below;

$$V_{mode} = a^{(2)}_{T_{piezo}}\left((T_{piezo} - c_{T_{piezo}})^2 + b^{(2)}_{T_{piezo}}\right) + a^{(1)}_{T_{piezo}}(T_{piezo} - c_{T_{piezo}}) +$$
$$a^{(2)}_{T_e}((T_e - c_{T_e})^2 + b^{(2)}_{T_e}) + a^{(1)}_{T_e}(T_e - c_{T_e}) + a^{(2)}_\theta((\theta - c_\theta)^2 + b^{(2)}_\theta) +$$
$$a^{(1)}_\theta(\theta - c_\theta) + a^{(2)}_Y((Y - c_Y)^2 + b^{(2)}_Y) + a^{(1)}_Y(Y - c_Y) + a^{(2)}_\rho((\rho - c_\rho)^2 + b^{(2)}_\rho) +$$
$$a^{(1)}_\rho(Y - c_\rho) + d_{T_{piezo}T_e}(T_{piezo} - c_{T_{piezo}})(T_e - c_{T_e}) +$$
$$d_{T_{piezo}\theta}(T_{piezo} - c_{T_{piezo}})(\theta - c_\theta) + d_{T_{piezo}Y}(T_{piezo} - c_{T_{piezo}})(Y - c_Y) +$$
$$d_{T_{piezo}\rho}(T_{piezo} - c_{T_{piezo}})(\rho - c_\rho) + d_{T_e\theta}(T_e - c_{T_e})(\theta - c_\theta) +$$
$$d_{T_eY}(T_e - c_{T_e})(Y - c_Y) + d_{T_e\rho}(T_e - c_{T_e})(\rho - c_\rho) +$$
$$d_{\theta Y}(\theta - c_\theta)(Y - c_Y) + d_{\theta\rho}(T_\theta - c_\theta)(\rho - c_\rho) + d_{Y\rho}(Y - c_Y)(\rho - c_\rho) + e$$

Eq. (1)

in Eq. (1), $V_{mode}$ is Vsh0 or Vsp, coefficients for Vsh0 and Vsp are as listed in Table 1 below, λ is a wavelength determined by a pitch of electrode fingers of the interdigital transducer electrode, $T_{piezo}$ is a film thickness (λ) of the piezoelectric layer, $T_e$ is a film thickness (λ) of the interdigital transducer electrode, θ is a second Euler angle (°) of the piezoelectric layer, Y is the Young's modulus (GPa) of the interdigital transducer electrode, and ρ is the density ($g/cm^3$) of the interdigital transducer electrode:

TABLE 1

| MODE ACOUSTIC VELOCITY | V_SH0 | V_SP |
|---|---|---|
| aTpiezo(2) | 7.048E+00 | 4.060E+01 |
| aTpiezo(1) | −1.560E+00 | −3.466E+00 |
| bTpiezo(2) | −1.250E−02 | −1.250E−02 |
| cTpiezo | 3.500E−01 | 3.500E−01 |
| aTe(2) | 5.482E+01 | 7.950E+01 |
| aTe(1) | −7.154E+00 | −7.636E+00 |
| bTe(2) | −3.200E−03 | −3.200E−03 |
| cTe | 1.200E−01 | 1.200E−01 |
| a θ (2) | 0.000E+00 | 0.000E+00 |
| a θ (1) | 8.215E−03 | 1.271E−02 |
| b θ (2) | 0.000E+00 | 0.000E+00 |
| c θ | 1.395E+02 | 1.395E+02 |
| aY(2) | 0.000E+00 | 3.371E−06 |
| aY(1) | 1.347E−04 | −6.086E−04 |
| bY(2) | 0.000E+00 | −3.954E+04 |
| cY | 3.515E+02 | 3.515E+02 |
| a ρ (2) | 3.156E−03 | 3.849E−03 |
| a ρ (1) | −7.670E−02 | −8.435E−02 |
| b ρ (2) | −5.832E+01 | −5.832E+01 |
| c ρ | 1.350E+01 | 1.350E+01 |
| dTpiezoTe | 0.000E+00 | 0.000E+00 |
| dTpiezo θ | 0.000E+00 | 0.000E+00 |
| dTpiezoY | 0.000E+00 | 0.000E+00 |
| dTpiezo ρ | 9.988E−02 | 9.090E−02 |
| dTe θ | 0.000E+00 | 0.000E+00 |
| dTeY | −7.413E−03 | −1.586E−02 |
| dTe ρ | 0.000E+00 | 0.000E+00 |
| d θ Y | 0.000E+00 | 0.000E+00 |
| d θ ρ | 0.000E+00 | 0.000E+00 |
| dY ρ | −4.456E−05 | −9.875E−05 |
| e | 3.248E+00 | 4.270E+00. |

2. An acoustic wave device comprising:
a high-acoustic-velocity layer;
an intermediate layer laminated on the high-acoustic-velocity layer, the intermediate layer being made of silicon oxide;
a piezoelectric layer laminated on the intermediate layer and being made of lithium tantalate; and
an interdigital transducer electrode provided on the piezoelectric layer; wherein
an acoustic velocity of a bulk wave propagating in the high-acoustic-velocity layer is higher than an acoustic velocity of an acoustic wave propagating in the piezoelectric layer; and
an acoustic velocity Vsub of a fast transversal bulk wave propagating in the high-acoustic-velocity layer satisfies Vsh0≤Vsub≤Vsp with respect to an acoustic velocity Vsh0 of an SH0 mode and an acoustic velocity Vsp of a mode becoming a spurious of which acoustic velocity is not lower than the acoustic velocity of the SH0 mode, the acoustic velocity Vsh0 and the acoustic velocity Vsp being obtained from Eq. (2) below;

$$V_{mode} = a^{(2)}_{T_{piezo}}\left((T_{piezo} - c_{T_{piezo}})^2 + b^{(2)}_{T_{piezo}}\right) +$$
$$a^{(1)}_{T_{piezo}}(T_{piezo} - c_{T_{piezo}}) + a^{(2)}_{T_{int}}((T_{int} - c_{T_{int}})^2 + b^{(2)}_{T_{int}}) +$$
$$a^{(1)}_{T_{int}}(T_{int} - c_{T_{int}}) + a^{(2)}_{T_e}((T_e - c_{T_e})^2 + b^{(2)}_{T_e}) +$$

Eq. (2)

-continued $$a_{T_e}^{(1)}(T_e - c_{T_e}) + a_\theta^{(2)}((\theta - c_\theta)^2 + b_\theta^{(2)}) + a_\theta^{(1)}(\theta - c_\theta) +$$
$$a_Y^{(2)}((Y - c_Y)^2 + b_Y^{(2)}) + a_Y^{(1)}(Y - c_Y) + a_\rho^{(2)}((\rho - c_\rho)^2 + b_\rho^{(2)}) +$$
$$a_\rho^{(1)}(Y - c_\rho) + d_{T_{piezo}T_{int}}(T_{piezo} - c_{T_{piezo}})(T_{int} - c_{int}) +$$
$$d_{T_{piezo}T_e}(T_{piezo} - c_{T_{piezo}})(T_e - c_{T_e}) + d_{T_{piezo}\theta}(T_{piezo} - c_{T_{piezo}})(\theta - c_\theta) +$$
$$d_{T_{piezo}Y}(T_{piezo} - c_{T_{piezo}})(Y - c_Y) + d_{T_{piezo}\rho}(T_{piezo} - c_{T_{piezo}})(Y - c_\rho) +$$
$$d_{T_{int}T_e}(T_{int} - c_{T_{int}})(T_e - c_{T_e}) + d_{T_{int}\theta}(T_{int} - c_{T_e})(\theta - c_\theta) +$$
$$d_{T_{int}Y}(T_{int} - c_{T_{int}})(Y - c_Y) + d_{T_{int}\rho}(T_{int} - c_{T_{int}})(\rho - c_\rho) +$$
$$d_{T_e\theta}(T_e - c_{T_e})(\theta - c_\theta) + d_{T_eY}(T_e - c_{T_e})(Y - c_Y) +$$
$$d_{T_e\rho}(T_e - c_{T_e})(\rho - c_\rho) + d_{\theta Y}(\theta - c_\theta)(Y - c_Y) +$$
$$d_{\theta\rho}(T_\theta - c_\theta)(\rho - c_\rho) + d_{Y\rho}(Y - c_Y)(\rho - c_\rho) + e$$

in Eq. (2), $V_{mode}$ is Vsh0 or Vsp, coefficients for Vsh0 and Vsp are as listed in Table 2 below, λ is a wavelength determined by a pitch of electrode fingers of the interdigital transducer electrode, $T_{piezo}$ is a film thickness (λ) of the piezoelectric layer, $T_e$ is a film thickness (λ) of the interdigital transducer electrode, θ is a second Euler angle (°) of the piezoelectric layer, Y is the Young's modulus (GPa) of the interdigital transducer electrode, and ρ is the density (g/cm³) of the interdigital transducer electrode:

TABLE 2

| MODE ACOUSTIC VELOCITY | V_SH0 | V_SP |
|---|---|---|
| aTpiezo(2) | 0.000E+00 | −1.163E+01 |
| aTpiezo(1) | 8.939E−01 | −1.176E+00 |
| bTpiezo(2) | 0.000E+00 | 1.250E−02 |
| cTpiezo | 2.500E−01 | 2.500E−01 |
| aTint(2) | 0.000E+00 | −2.248E+01 |
| aTint(1) | −5.610E−01 | 1.908E+00 |
| bTint(2) | 0.000E+00 | 1.250E−02 |
| cTint | 2.500E−01 | 2.500E−01 |
| aTe(2) | 4.789E+01 | 0.000E+00 |
| aTe(1) | −6.682E+00 | −6.371E+00 |
| bTe(2) | 2.000E−03 | 0.000E+00 |
| cTe | 1.000E−01 | 1.000E−01 |
| a θ (2) | −2.255E−04 | 0.000E+00 |
| a θ (1) | 2.552E−04 | 0.000E+00 |
| b θ (2) | 1.667E+02 | 0.000E+00 |
| c θ | 1.400E+02 | 1.400E+02 |
| aY(2) | 0.000E+00 | 0.000E+00 |
| aY(1) | −2.030E−05 | 6.691E−04 |
| bY(2) | 0.000E+00 | 0.000E+00 |
| cY | 4.218E+02 | 4.218E+02 |
| a ρ (2) | 2.215E−03 | 0.000E+00 |
| a ρ (1) | −5.835E−02 | −4.208E−02 |
| b ρ (2) | 5.832E+01 | 0.000E+00 |
| c ρ | 1.350E+01 | 1.350E+01 |
| dTpiezoTin | 2.593E+00 | −2.616E+01 |
| dTpiezoTe | 1.069E+01 | 0.000E+00 |
| dTpiezo θ | 0.000E+00 | 0.000E+00 |
| dTpiezoY | −2.009E−03 | −2.664E−03 |
| dTpiezo ρ | 7.747E−02 | 0.000E+00 |
| dTintTe | 0.000E+00 | 2.905E+01 |
| dTint θ | 0.000E+00 | −4.267E−02 |

TABLE 2-continued

| MODE ACOUSTIC VELOCITY | V_SH0 | V_SP |
|---|---|---|
| dTintY | 5.308E−04 | 0.000E+00 |
| dTint ρ | 0.000E+00 | 1.901E−01 |
| dTe θ | 0.000E+00 | 1.520E−01 |
| dTeY | −5.003E−03 | 7.229E−03 |
| dTe ρ | −1.701E−01 | −5.170E−01 |
| d θ Y | 0.000E+00 | 0.000E+00 |
| d θ ρ | 0.000E+00 | 9.593E−04 |
| dY ρ | −3.071E−05 | 0.000E+00 |
| e | 3.120E+00 | 5.104E+00. |

3. The acoustic wave device according to claim 1, wherein a cut-angle of the lithium tantalate is in a range of about −10° to about +65° in Y cut X SAW propagation.

4. The acoustic wave device according to claim 1, wherein at least one dielectric selected from a group of $Al_2O_3$, MgO, BeO, $HfO_2$, AlN, SiN, TiN, ZrN, SiC, TiC, DLC, $B_4C$, $TiB_2$, $ZrB_2$, and $NbB_2$ is provided between the interdigital transducer electrode and the piezoelectric layer.

5. The acoustic wave device according to claim 1, wherein the piezoelectric layer is a $LiTaO_3$ layer.

6. The acoustic wave device according to claim 1, wherein the high-acoustic-velocity layer includes Si.

7. The acoustic wave device according to claim 1, wherein at least one reflector is provided on the piezoelectric layer.

8. The acoustic wave device according to claim 1, wherein the acoustic wave device defines an acoustic wave resonator.

9. The acoustic wave device according to claim 1, wherein the interdigital transducer electrode is a multilayer metal film that includes Ti, Mo, and Ti laminated in order.

10. The acoustic wave device according to claim 1, wherein the second Euler angle θ (°) of the piezoelectric layer is between about 120° and about 160°.

11. The acoustic wave device according to claim 2, wherein a cut-angle of the lithium tantalate is in a range of about −10° to about +65° in Y cut X SAW propagation.

12. The acoustic wave device according to claim 2, wherein at least one dielectric selected from a group of $Al_2O_3$, MgO, BeO, $HfO_2$, AlN, SiN, TiN, ZrN, SiC, TiC, DLC, $B_4C$, $TiB_2$, $ZrB_2$, and $NbB_2$ is provided between the interdigital transducer electrode and the piezoelectric layer.

13. The acoustic wave device according to claim 2, wherein the piezoelectric layer is a $LiTaO_3$ layer.

14. The acoustic wave device according to claim 2, wherein the high-acoustic-velocity layer includes Si.

15. The acoustic wave device according to claim 2, wherein at least one reflector is provided on the piezoelectric layer.

16. The acoustic wave device according to claim 2, wherein the acoustic wave device defines an acoustic wave resonator.

17. The acoustic wave device according to claim 2, wherein the interdigital transducer electrode is a multilayer metal film that includes Ti, Mo, and Ti laminated in order.

18. The acoustic wave device according to claim 2, wherein the second Euler angle θ (°) of the piezoelectric layer is between about 120° and about 160°.

* * * * *